United States Patent
Yau et al.

(10) Patent No.: US 6,448,187 B2
(45) Date of Patent: Sep. 10, 2002

(54) METHOD OF IMPROVING MOISTURE RESISTANCE OF LOW DIELECTRIC CONSTANT FILMS

(75) Inventors: Wai-Fan Yau, Mountain View; David Cheung, Foster city; Nasreen Gazala Chopra, Menlo Park; Yung-Cheng Lu, San Jose; Robert Mandal, Saratoga; Farhad Moghadam, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 2 days.

(21) Appl. No.: 09/792,122

(22) Filed: Feb. 21, 2001

Related U.S. Application Data

(63) Continuation of application No. 09/187,460, filed on Nov. 4, 1998, now Pat. No. 6,245,690.

(51) Int. Cl.$^7$ ................................................. H01L 21/31
(52) U.S. Cl. ...................... 438/758; 438/780; 438/781; 438/789; 438/790; 427/579; 427/489; 427/503
(58) Field of Search ................................ 438/758, 780, 438/789, 781, 623, 790; 427/579, 489, 41, 503

(56) References Cited

U.S. PATENT DOCUMENTS

| | | | |
|---|---|---|---|
| 5,093,153 A | 3/1992 | Brochot et al. | 427/41 |
| 5,298,587 A | 3/1994 | Hu et al. | 528/10 |
| 5,494,712 A | 2/1996 | Hu et al. | 427/489 |
| 5,521,126 A | 5/1996 | Okamura et al. | 437/235 |
| 5,554,570 A | 9/1996 | Maeda et al. | 437/235 |
| 5,626,924 A | 5/1997 | Ishikawa | 427/579 |
| 5,638,251 A | 6/1997 | Goel et al. | 361/313 |
| 5,723,909 A | 3/1998 | Yano et al. | 257/760 |
| 5,789,325 A | 8/1998 | Chandra et al. | 438/781 |
| 5,950,101 A | 9/1999 | Yano et al. | 438/618 |
| 6,054,379 A | 4/2000 | Yau et al. | 438/623 |
| 6,072,227 A | 6/2000 | Yau et al. | 257/642 |
| 6,114,259 A | 9/2000 | Sukharev et al. | 438/789 |
| 6,147,009 A | 11/2000 | Grill et al. | 438/780 |
| 6,245,690 B1 * | 6/2001 | Yau et al. | 438/780 |

FOREIGN PATENT DOCUMENTS

| | | | |
|---|---|---|---|
| JP | 407066287 | 3/1995 | H01L/21/768 |

* cited by examiner

*Primary Examiner*—John F. Niebling
*Assistant Examiner*—Olivia T Luk
(74) *Attorney, Agent, or Firm*—Moser, Patterson, & Sheridan

(57) ABSTRACT

A method and apparatus for depositing a low dielectric constant film includes depositing a silicon oxide based film, preferably by reaction of an organosilicon compound and an oxidizing gas at a low RF power level from about 10W to about 500W, exposing the silicon oxide based film to water or a hydrophobic-imparting surfactant such as hexamethyldisilazane, and curing the silicon oxide based film at an elevated temperature. Dissociation of the oxidizing gas can be increased in a separate microwave chamber to assist in controlling the carbon content of the deposited film. The moisture resistance of the silicon oxide based films is enhanced.

30 Claims, 10 Drawing Sheets

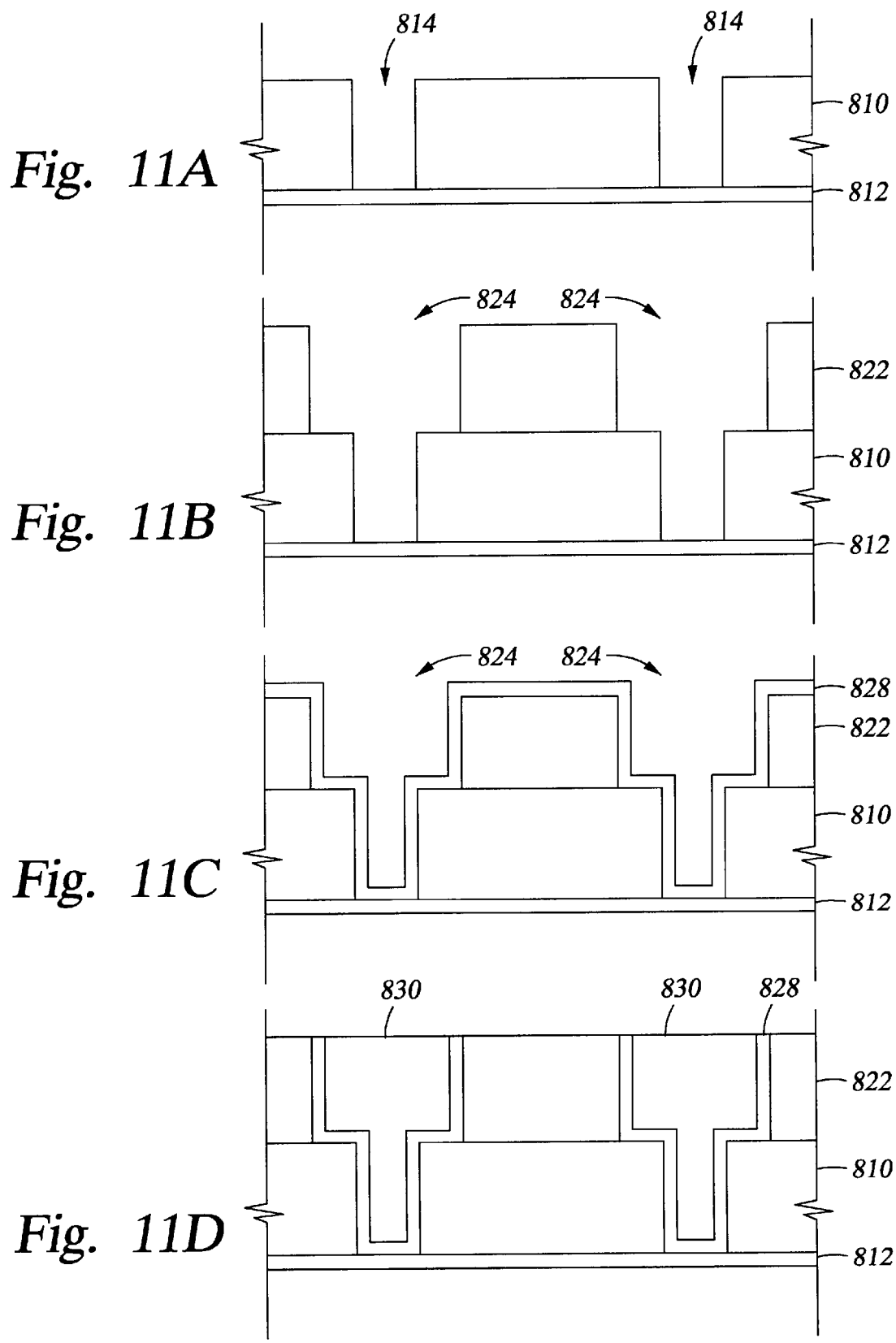

METHOD OF IMPROVING MOISTURE RESISTANCE OF LOW DIELECTRIC CONSTANT FILMS

This is a continuation of copending application(s) Ser. No. 09/187,460 filed on Nov. 4, 1998 now U.S. Pat. No. 6,245,690.

BACKGROUND OF THE DISCLOSURE

1. Field of the Invention

The present invention relates to the fabrication of integrated circuits. More particularly, the invention relates to a process and apparatus for treating dielectric layers deposited on a substrate.

2. Background of the Invention

One of the primary steps in the fabrication of modem semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide", which is incorporated by reference herein. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries.

In order to further reduce the size of devices on integrated circuits, it has become necessary to use conductive materials having low resistivity and insulators having low k (dielectric constant<4.0) to reduce the capacitive coupling between adjacent metal lines. Liner/barrier layers have been used between the conductive materials and the insulators to prevent diffusion of byproducts such as moisture onto the conductive material as described in International Publication Number WO 94/01885. For example, moisture that can be generated during formation of a low k insulator readily diffuses to the surface of the conductive metal and increases the resistivity of the conductive metal surface. A barrier/liner layer formed from conventional silicon oxide or silicon nitride materials can block the diffusion of the byproducts. However, the barrier/liner layers typically have dielectric constants that are significantly greater than 4.0, and the high dielectric constants result in a combined insulator that does not significantly reduce the dielectric constant.

FIG. 1A illustrates a PECVD process for depositing a barrier/liner layer as described in International Publication Number WO 94/01885. The PECVD process deposits a multi-component dielectric layer wherein a silicon dioxide ($SiO_2$) liner layer 2 is first deposited on a patterned metal layer having metal lines 3 formed on a substrate 4. The liner layer 2 is deposited by a plasma enhanced reaction of silane ($SiH_4$) and nitrous oxide ($N_2O$) at 300° C. A self-planarizing low k dielectric layer 5 is then deposited on the liner layer 2 by reaction of a silane compound and a peroxide compound. The self-planarizing layer 5 retains moisture that is removed by curing at an elevated temperature. The liner layer 2 is an oxidized silane film that has effective barrier properties when deposited in a manner which provides a dielectric constant of at least 4.5. The dielectric constant of the oxidized silane film can be decreased to about 4.1 by altering process conditions in a manner that decreases moisture barrier properties of the film. Conventional liner layers, such as $Si_3N_4$, have even higher dielectric constants, and the combination of low k dielectric layers with high k dielectric liner layers can provide little or no improvement in the overall stack dielectric constant and capacitive coupling.

As shown in FIG. 1B, WO 94/01885 further describes an optional $SiO_2$ cap layer 6 that is deposited on the low k dielectric layer 5 by the reaction of silane and $N_2O$. The cap layer 6 is also an oxidized silane film that has good barrier properties when deposited in a manner that provides a dielectric constant of about 4.5. Both the liner layer 2 and the cap layer 6 have a dielectric constant greater than 4.5 and the high dielectric constant layers substantially detract from the benefit of the low k dielectric layer 5.

As devices get smaller, liner layers and cap layers having high dielectric constants contribute more to the overall dielectric constant of a multi-component dielectric layer. Furthermore, known low k dielectric materials generally have low oxide content which makes the material inadequate as an etch stop layer during etching of vias and/or interconnects. Silicon nitride has been the etch stop material of choice for making interconnect lines in low k dielectric materials. However, the silicon nitride has a relatively high dielectric constant (dielectric constant of about 7) compared to the surrounding low k dielectric layers. It has also been discovered that the silicon nitride may significantly increase the capacitive coupling between interconnect lines, even when an otherwise low k dielectric material is used as the primary insulator. This may lead to crosstalk and/or resistance-capacitance (RC) delay that degrades the overall performance of the device. Thus, the silicon nitride etch stop layers are typically removed after etching of the underlying dielectric layers.

Ideally, a low k dielectric layer having both good barrier properties for use as a liner layer and sufficient oxide content for use as an etch stop could be identified and deposited in the same chambers as existing low k dielectric materials. Such barrier layers would not increase the overall dielectric constant of the dielectric layers, and such an etch stop layer would not have to be removed after etching the underlying layers.

U.S. Pat. No. 5,554,570 describes barrier layers for use with thermal CVD silicon oxides wherein an organosilane having a C—H group is oxidized instead of silane to increase the density of deposited films and to improve adhesion between the layers. For example, a thermal CVD layer produced from tetraethoxysilane (TEOS) and ozone, may be deposited between PECVD silicon oxide films produced from an organosilicon and $N_2O$ or $O_2$. The barrier layers described in the '570 patent are preferably dense silicon oxide layers having low carbon contents. The dense layers are deposited using 400 W of high frequency RF power although the use of low frequency RF power is asserted to improve film stress. The barrier layers are preferably produced from alkoxysilanes or chlorinated alkylsilanes and $N_2O$ to reduce carbon content and increase the density of the layers.

The moisture resistance of silicon oxide films can be improved by exposure to surfactants prior to deposition of subsequent layers. The use of surfactants for treatment of silicon oxide films is described in, for example, Sol-Gel Science, by C J Brinker and G W Scherer, Academic Press, 1990.

There remains a need for dielectric layers having low dielectric constants and good moisture barrier properties for use in integrated circuits.

SUMMARY OF THE INVENTION

The present invention provides a method and apparatus for treating a deposited silicon oxide-based layer having a low dielectric constant to improve moisture resistance. The deposited silicon oxide-based layer is exposed to water or a hydrophobic-imparting surfactant during film deposition, prior to curing, or at an elevated temperature. The treated silicon oxide-based layer is preferably produced by plasma assisted chemical vapor deposition of an organosilane, an organosiloxane, or combinations thereof, using RF or microwave power to generate reactive oxygen atoms. Treatment with water or a hydrophobic-imparting surfactant during film deposition, or prior to curing at an elevated temperature, improves the moisture resistance of the deposited film. The silicon oxide based films are preferably exposed to water or a hydrophobic-imparting surfactant selected from a group consisting of hexamethyldisilazane, trimethylsilyldiethylamine, phenyldimethylsilyldimethylamine, trimethoxysilyldimethylamine, tris(trifluoromethyl) silyldimethylamine, bis(trimethylsilyl)hydrazine, 1-phenyldimethylsilyl-2-methylhydrazine, 1-trimethoxysilyl-2-methylhydrazine, 1-tris (trifluoromethylsilyl)-2-methylhydrazine, and trimethylchlorosilane. The properties of the silicon oxide-based layers are readily controlled by process variations, and different layers can be deposited in one deposition chamber as shown for an improved dual damascene process. In addition, the silicon oxide-based layers can be used as an adhesive layer between different layers, or as an intermetal dielectric layer.

A preferred silicon oxide-based layer is produced by reaction of nitrous oxide, $N_2O$, and a silicon compound containing Si—H bonds, such as methylsilane, $CH_3SiH_3$, or dimethylsilane, $(CH_3)_2SiH_2$. The deposited film is preferably exposed to water at a temperature from about 50° C. to about 100° C., and is then cured at an elevated temperature from about 100° C. to about 450° C. Water can be deposited on the film as a liquid or as a vapor.

The silicon oxide-based layers are cured in the deposition chamber, or a separate heated chamber, at low pressure and high temperature to stabilize properties. The silicon oxide-based layers are most preferably produced using separate applications of RF power to the deposition chamber to increase porosity of the deposited layers. The use of low levels of RF power is preferred at chamber pressures less than about 10 Torr. Microwave power is preferably provided to oxidizing gases in a dissociation chamber to control formation of reactive oxidizers without increasing the power level in the deposition chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 11A–11D are cross sectional views showing an integrated dual damascene deposition sequence wherein the silicon oxide of the present invention is used to eliminate a conventional etch stop.

Figure 1A:
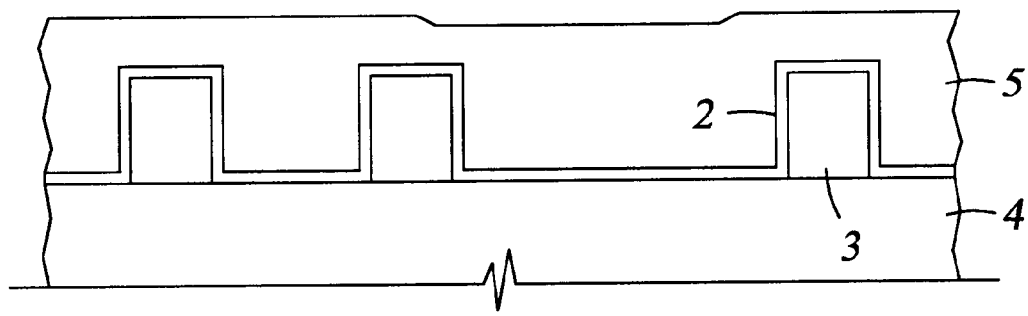
FIGS. 1A–1B (Prior Art) are schematic diagrams of dielectric layers deposited on a substrate by the processes known in the art.
Figure 1B:
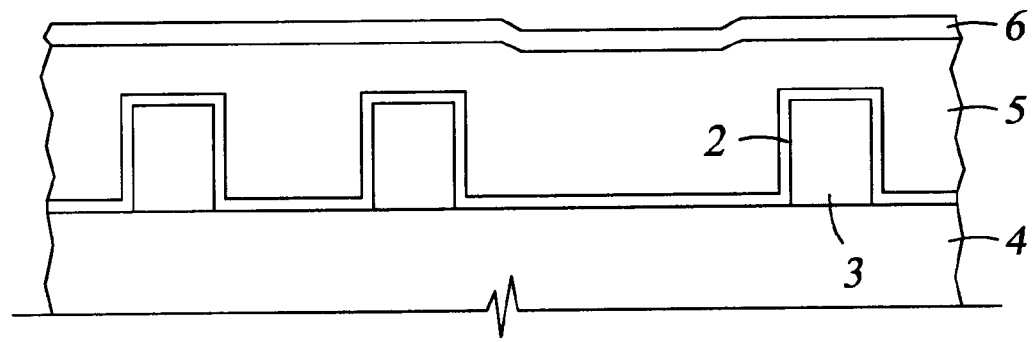

For a further understanding of the present invention, reference should be made to the ensuing detailed description.

DESCRIPTION OF A PREFERRED EMBODIMENT

The present invention provides a method and apparatus for depositing a silicon oxide-based layer, and for treating the deposited silicon oxide-based layer to improve moisture barrier properties. The present invention preferably deposits a silicon oxide-based layer having a low dielectric constant, a high oxide content, and sufficient carbon content to provide barrier properties, and exposes the deposited silicon oxide-based layer to water or a hydrophobic-imparting surfactant to improve moisture barrier properties. The preferred silicon oxide-based layer comprises an oxidized organosilane or organosiloxane and can be used as a lining layer adjacent other dielectric materials, as an etch stop layer adjacent dielectric materials having lower oxide content, as an intermetal dielectric layer, and as an adhesion layer between different materials.

The oxidized organosilane material is preferably deposited by plasma assisted oxidation of the organosilane or organosiloxane compounds using from about 10W to about 200W of constant RF power, or from about 20W to about 500W of pulsed RF power. The silicon oxide-based layer can also be deposited using frequent breaks, such as changing chambers or providing cooling time, to improve porosity. The RF power is preferably provided at a high frequency such as between 13 MHz and 14 MHz. The RF power is preferably provided in short duration cycles wherein the power is on at the stated levels for cycles less than about 200 Hz and the on cycles total from about 10% to about 30% of the total duty cycle. Intermittent RF power can operate at higher peak power levels and provide the same total power input as constant RF power at a lower power level.

Carbon which remains in the silicon oxide layer contributes to low dielectric constants and barrier properties. The remaining carbon is between about 1% and about 50% by atomic weight, and preferably includes sufficient C—H or C—F bonds to provide hydrophobic properties to the silicon oxide-based layer resulting in significantly lower dielectric constants and improved moisture barrier properties.

The silicon oxide-based layers are produced from silicon compounds that include carbon in organo groups that are not readily removed by oxidation at processing conditions. Preferably —C—H bonds are included such as in alkyl or aryl groups, or fluorinated carbon derivatives thereof. Suitable organo groups also can include alkenyl and cyclohexenyl groups and functional derivatives. The organo silicon compounds include:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| dimethylsilanediol, | $(CH_3)_2$—$Si$—$(OH)_2$ |
| ethylsilane, | $CH_3$—$CH_2$—$SiH_3$ |
| phenylsilane, | $C_6H_5$—$SiH_3$ |
| diphenylsilane, | $(C_6H_5)_2$—$SiH_2$ |
| diphenylsilanediol, | $(C_6H_5)_2$—$Si$—$(OH)_2$ |
| methylphenylsilane, | $C_6H_5$—$SiH_2$—$CH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —(—$SiH_2CH_2$—)$_3$— (cyclic) |
| 1,3-dimethyldisiloxane, | $CH_3$—$SiH_2$—$O$—$SiH_2$—$CH_3$ |
| 1,1,3,3-tetramethyldisiloxane, | $(CH_3)_2$—$SiH$—$O$—$SiH$—$(CH_3)_2$ |
| hexamethyldisiloxane, | $(CH_3)_3$—$Si$—$O$—$Si$—$(CH_3)_3$ |
| 1,3-bis(silanomethylene)disiloxane, | $(SiH_3$—$CH_2$—$SiH_2$—$)_2$—$O$ |
| bis(1-methyldisiloxanyl)methane, | $(CH_3$—$SiH_2$—$O$—$SiH_2$—$)_2$—$CH_2$ |
| 2,2-bis(1-methyldisiloxanyl)propane, | $(CH_3$—$SiH_2$—$O$—$SiH_2$—$)_2$—$C(CH_3)_2$ |
| 2,4,6,8-tetramethylcyclotetrasiloxane, | —(—$SiHCH_3$—$O$—)$_4$— (cyclic) |
| octamethylcyclotetrasiloxane, and | —(—$Si(CH_3)_2$—$O$—)$_4$— (cyclic) |
| 2,4,6,8,10-pentamethylcyclopentasiloxane, | —(—$SiHCH_3$—$O$—)$_5$— (cyclic) |
| 1,3,5,7-tetrasilano-2,6-dioxy-4,8-dimethylene, | —(—$SiH_2$—$CH_2$—$SiH_2$—$O$—)$_2$— (cyclic) |

The organo silicon compounds are oxidized during plasma assisted deposition by reaction with oxygen ($O_2$) or oxygen containing compounds such as nitrous oxide ($N_2O$), ozone ($O_3$), carbon dioxide ($CO_2$), and water ($H_2O$), preferably $N_2O$, such that the carbon content of the deposited film is from 1 to 50% by atomic weight, preferably about 5 to 30%. The oxidized organo silicon layer has a dielectric constant less than 3.0 and has excellent barrier properties. The oxidized organo silicon layers further have high oxide contents in comparison to conventional low k dielectric layers and good adhesion properties.

Oxygen and oxygen containing compounds are preferably dissociated to increase reactivity when necessary to achieve a desired carbon content in the deposited film. RF power can be coupled to the deposition chamber to increase dissociation of the oxidizing compounds. The oxidizing compounds may also be dissociated in a microwave chamber prior to entering the deposition chamber to reduce excessive dissociation of the silicon containing compounds. Deposition of the silicon-based oxide layer can be continuous or discontinuous. Although deposition preferably occurs in a single deposition chamber, the layer can be deposited sequentially in two or more deposition chambers. Furthermore, RF power can be cycled or pulsed to reduce heating of the substrate and promote greater porosity in the deposited film. Curing of the deposited film can occur in the same chamber or in a separate heated chamber.

The organosilane and organosiloxane compounds preferably include the structures:

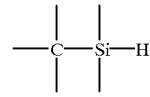

wherein each Si is bonded to one or two carbon atoms, and C is included in an organo group, preferably alkyl or alkenyl groups such as —$CH_3$, —$CH_2$—$CH_3$, —$CH_2$—, or —$CH_2$—$CH_2$—, or fluorinated carbon derivatives thereof. The carbon atoms in the fluorinated carbon derivatives may be partially or fully fluorinated to replace hydrogen atoms. When an organosilane or organosiloxane compound includes two or more Si atoms, each Si is separated from another Si by —O—, —C—, or —C—C—, wherein C is included in an organo group, preferably alkyl or alkenyl groups such as —$CH_2$—, —$CH_2$—$CH_2$—, —$CH(CH_3)$— or —$C(CH_3)_2$—, or fluorinated carbon derivatives thereof. The preferred organosilane and organosiloxane compounds are gases or liquids near room temperature and can be volatilized above about 10 Torr. Preferred organosilanes and organosiloxanes include:

| | |
|---|---|
| methylsilane, | $CH_3SiH_3$ |
| dimethylsilane, | $(CH_3)_2$—$SiH_2$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | —(—$SiH_2CH_2$—)$_3$— (cyclic) |
| 1,3-dimethyldisiloxane, | $CH_3$—$SiH_2$—$O$—$SiH_2$—$CH_3$ |
| 1,3-bis(silanomethylene)disiloxane, | $(SiH_3$—$CH_2$—$SiH_2$—$)_2$—$O$ |
| bis(1-methyldisiloxanyl)methane, | $(CH_3$—$SiH_2$—$O$—$SiH_2$—$)_2$—$CH_2$ |
| 2,2-bis(1-methyldisiloxanyl)propane, | $(CH_3$—$SiH_2$—$O$—$SiH_2$—$)_2$—$C(CH_3)_2$ |

| | -continued |
|---|---|
| 2,4,6,8-tetramethylcyclotetra-siloxane, | —(—SiHCH$_3$—O—)$_4$— (cyclic) |
| 2,4,6,8,10-pentamethylcyclopenta-siloxane, and | —(—SiHCH$_3$—O—)$_5$— (cyclic) |
| 1,3,5,7-tetrasilano-2,6-dioxy-4,8-dimethylene, | —(—SiH$_2$—CH$_2$—SiH$_2$—O—)$_2$— (cyclic) |
| and fluorinated carbon derivatives thereof, such as: | |
| 1,2-disilanotetrafluoro-ethylene. | SiH$_3$—CF$_2$—CF$_2$—SiH$_3$ |

The hydrocarbon groups in the organosilanes and organosiloxane may be partially or fully fluorinated to convert C—H bonds to C—F bonds. Many of the preferred organosilane and organosiloxane compounds are commercially available. A combination of two or more of the organosilanes or organosiloxanes can be employed to provide a blend of desired properties such as dielectric constant, oxide content, hydrophobicity, film stress, and plasma etching characteristics.

The organosilane and organosiloxane compounds are preferably oxidized during deposition by plasma assisted reaction with oxygen which is formed during the deposition process by decomposition of nitrous oxide (N$_2$O). Nitrous oxide does not react with the organosilanes or organosiloxanes without plasma assistance, and the oxygen-nitrogen bonds are readily broken at lower energies than the bonds in the organosilanes and organosiloxanes. The oxidized compounds adhere to contacted surfaces such as a patterned layer of a semiconductor substrate to form a deposited film. The deposited films are cured at pressures near or below deposition pressures at temperatures from about 100° C. to about 450° C., preferably near or above about 400° C. to stabilize the barrier properties of the films. The deposited film has sufficient carbon content to provide barrier properties. The carbon content preferably includes C—H or C—F bonds to provide a hydrophobic film that is an excellent moisture barrier.

The moisture barrier properties of deposited silicon oxide based layers is improved by exposing the deposited layer to water or a hydrophobic-imparting surfactant prior to curing. The deposited layer is exposed to water at a temperature from about 50° C. to about 100° C., including liquid or vapor, for sufficient time to wet the surface and any pores that are open to the surface. Alternatively, the deposited film is exposed to a hydrophobic-imparting surfactant that may be dissolved in a solvent and coated on the silicon oxide layer at a temperature from about 10° C. to about 100° C. to deposit the hydrophobic surfactant.

Hydrophobic-imparting surfactants include oils, fats, waxes, resins, and synthetic molecules that are antagonistic to water. The hydrophobic-imparting surfactants may be applied using a suitable solvent. Preferred hydrophobic-imparting surfactants are selected from a group consisting of hexanethyldisilazane, trimethylsilyldiethylamine, phenyldimethylsilyldimethylamine, trimethoxysilyldimethylamine, tris(trifluoromethyl) silyldimethylamine, bis(trimethylsilyl)hydrazine, 1-phenyldimethylsilyl-2-methyl-hydrazine, 1-trimethoxysilyl-2-methylhydrazine, 1-tris(trifluoromethylsilyl)-2-methyl-hydrazine, and trimethylchlorosilane. The hydrophobic-imparting surfactants are deposited at a temperature from about 10° C. to about 100° C. and coat the deposited silicon oxide-based layer with a thin layer that repels moisture. Hydrophobic-imparting surfactants also include synthetic molecules such as non-ionic poly(alkylene oxide) surfactants that are readily dissolved in a lower alkyl alcohol.

The present invention further provides a substrate processing system having a plasma reactor including a reaction zone, a substrate holder for positioning a substrate in the reaction zone, and a vacuum system. The processing system preferably comprises a gas/liquid distribution system connecting the reaction zone of the vacuum chamber to supplies of an organosilane or organosiloxane compound, an oxidizing gas, and an inert gas, and an RF generator coupled to the gas distribution system for generating a plasma in the reaction zone. The processing system further comprises a controller comprising a computer for controlling the plasma reactor, the gas distribution system, and the RF generator, and a memory coupled to the controller, the memory comprising a computer usable medium comprising a computer readable program code for selecting the process of depositing a silicon oxide based film, exposing the silicon oxide-based film to water or a hydrophobic surfactant, and curing the silicon oxide-based film.

The processing system may further comprise in one embodiment computer readable program code for selecting the process of depositing a liner of the treated silicon oxide based film, depositing a different dielectric layer, and optionally depositing a capping layer of the treated silicon oxide based film.

Further description of the invention will be directed toward a specific apparatus for depositing and treating the silicon oxide-based layers of the present invention and toward preferred silicon oxide-based films.

Exemplary CVD Plasma Reactor

Figure 2:
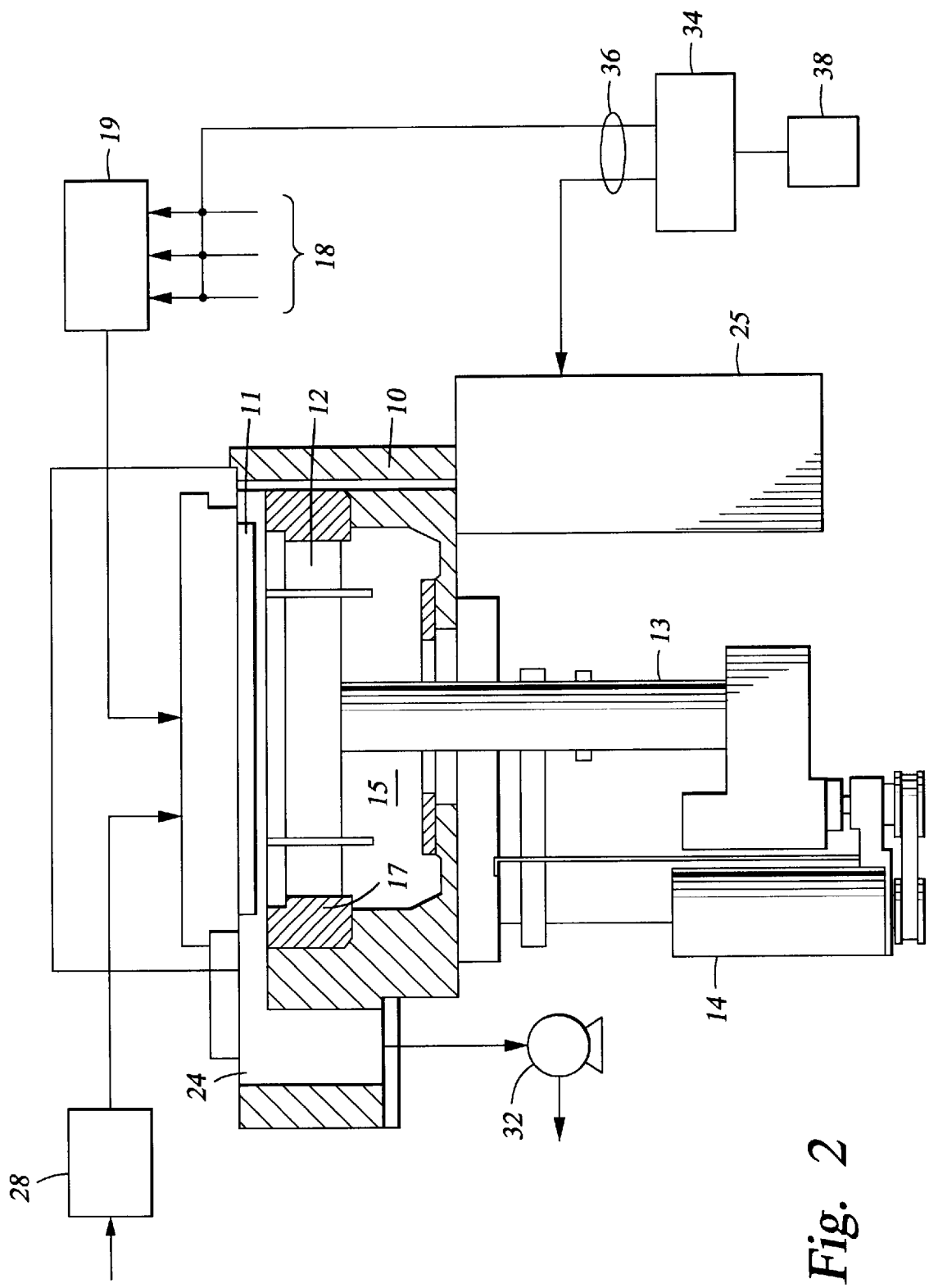
FIG. 2 is a cross-sectional diagram of an exemplary CVD plasma reactor configured for use according to the present invention.

One suitable vessel in which a method of the present invention can be carried out is shown in FIG. 2, which is a vertical, cross-section view of a parallel plate chemical vapor deposition CVD reactor 10 having a high vacuum region 15. Reactor 10 contains a gas distribution manifold 11 for dispersing process gases through perforated holes in the manifold to a substrate or wafer (not shown) that rests on a substrate support plate or susceptor 12 which is raised or lowered by a lift motor 14. A liquid injection system (not shown), such as typically used for liquid injection of TEOS, may also be provided for injecting a liquid organosilane and/or organosiloxane compound. The preferred organosilanes, such as methylsilane and dimethylsilane, are gases.

The reactor 10 includes heating of the process gases and substrate, such as by resistive heating coils (not shown) or external lamps (not shown). Referring to FIG. 2, susceptor 12 is mounted on a support stem 13 so that susceptor 12 (and the wafer supported on the upper surface of susceptor 12) can be controllably moved between a lower loading/off-loading position and an upper processing position which is closely adjacent to manifold 11.

When susceptor 12 and the wafer are in processing position 14, they are surrounded by an insulator 17 and process gases exhaust into a manifold 24. During processing, gases inlet to manifold 11 are uniformly distributed radially across the surface of the wafer. A vacuum pump 32 having a throttle valve controls the exhaust rate of gases from the chamber.

Before reaching manifold 11, deposition and carrier gases are input through gas lines 18 into a mixing system 19 where they are combined and then sent to manifold 11. An optional microwave applicator 28 can be located on the input gas line for the oxidizing gas to provide additional energy that dissociates only the oxidizing gas. The microwave applicator provides from 0 to 6000 W. Generally, the process gases supply lines 18 for each of the process gases also include (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a thermal process or a plasma enhanced process. In a plasma process, a controlled plasma is typically formed adjacent to the wafer by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12. The silicon oxide layers of the present invention are most preferably produced using low levels of constant high frequency RF power or pulsed levels of high frequency RF power. Pulsed RF power preferably provides 13.56 MHz RF power at about 20W to about 250W, most preferably from 20W to 150 W, during about 10% to about 30% of the duty cycle. Constant RF power preferably provides 13.56 MHz RF power at about 10W to about 200W, most preferably from 20W to 100W. Low power deposition preferably occurs at a temperature range from about −20° C. to about 40° C. At the preferred temperature range, the deposited film is partially polymerized during deposition and polymerization is completed during subsequent curing of the film.

When additional dissociation of the oxidizing gas is desired, an optional microwave chamber can be used to input from 0 to 2000 W of microwave power to the oxidizing gas prior to entering the deposition chamber. Separate addition of microwave power would avoid excessive dissociation of the silicon compounds prior to reaction with the oxidizing gas.

Typically, any or all of the chamber lining, gas inlet manifold faceplate, support stem 13, and various other reactor hardware is made out of material such as aluminum or anodized aluminum. An example of such a CVD reactor is described in U.S. Pat. No. 5,000,113, entitled "Thermal CVD/PECVD Reactor and Use for Thermal Chemical Vapor Deposition of Silicon Dioxide and In-situ Multi-step Planarized Process, issued to Wang et al. And assigned to Applied Materials, Inc., the assignee of the present invention.

The lift motor 14 raises and lowers susceptor 12 between a processing position and a lower, wafer-loading position. The motor, the gas mixing system 19, and the RF power supply 25 are controlled by a system controller 34 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

Figure 3:
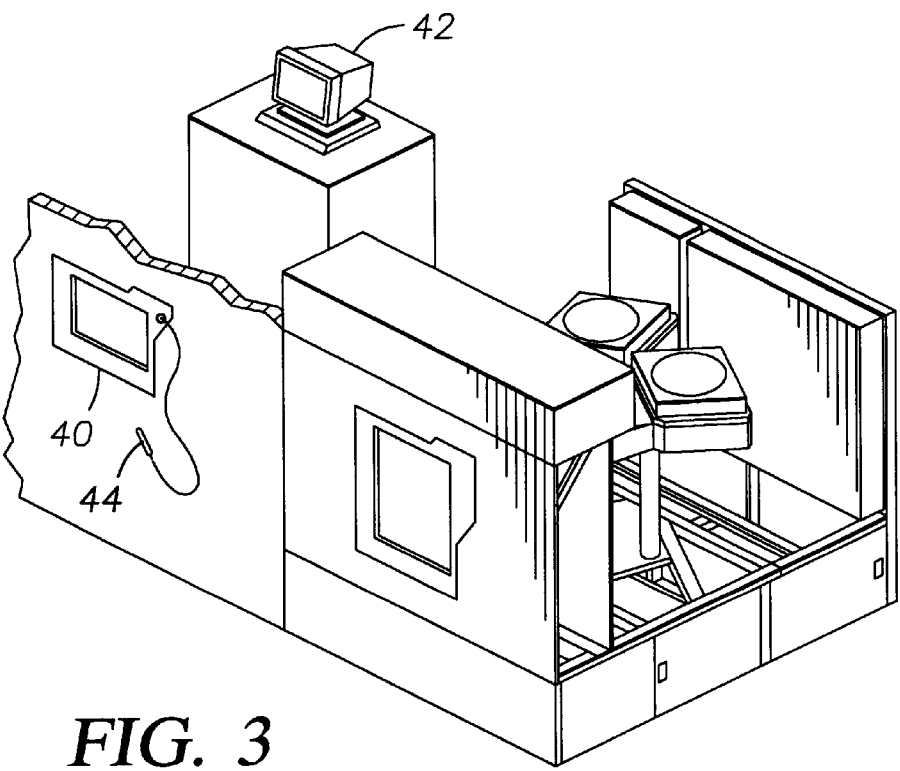
FIG. 3 is a diagram of the system monitor of the CVD plasma reactor of FIG. 2.

The system controller 34 operates under the control of a computer program stored on the hard disk drive 38. The computer program dictates the timing, mixture of gases, RF power levels, susceptor position, and other parameters of a particular process. The interface between a user and the system controller is via a CRT monitor 40 and light pen 44 which are depicted in FIG. 3. In the preferred embodiment a second monitor 42 is used, the first monitor 40 being mounted in the clean room wall for the operators and the other monitor 42 behind the wall for the service technicians. Both monitors 40, 42 simultaneously display the same information but only one light pen 44 is enabled. The light pen 44 detects light emitted by CRT display with a light sensor in the tip of the pen. To select a particular screen or function, the operator touches a designated area of the display screen and pushes the button on the pen 44. The touched area changes its highlighted color, or a new menu or screen is displayed, confirming communication between the light pen and the display screen.

Figure 4:
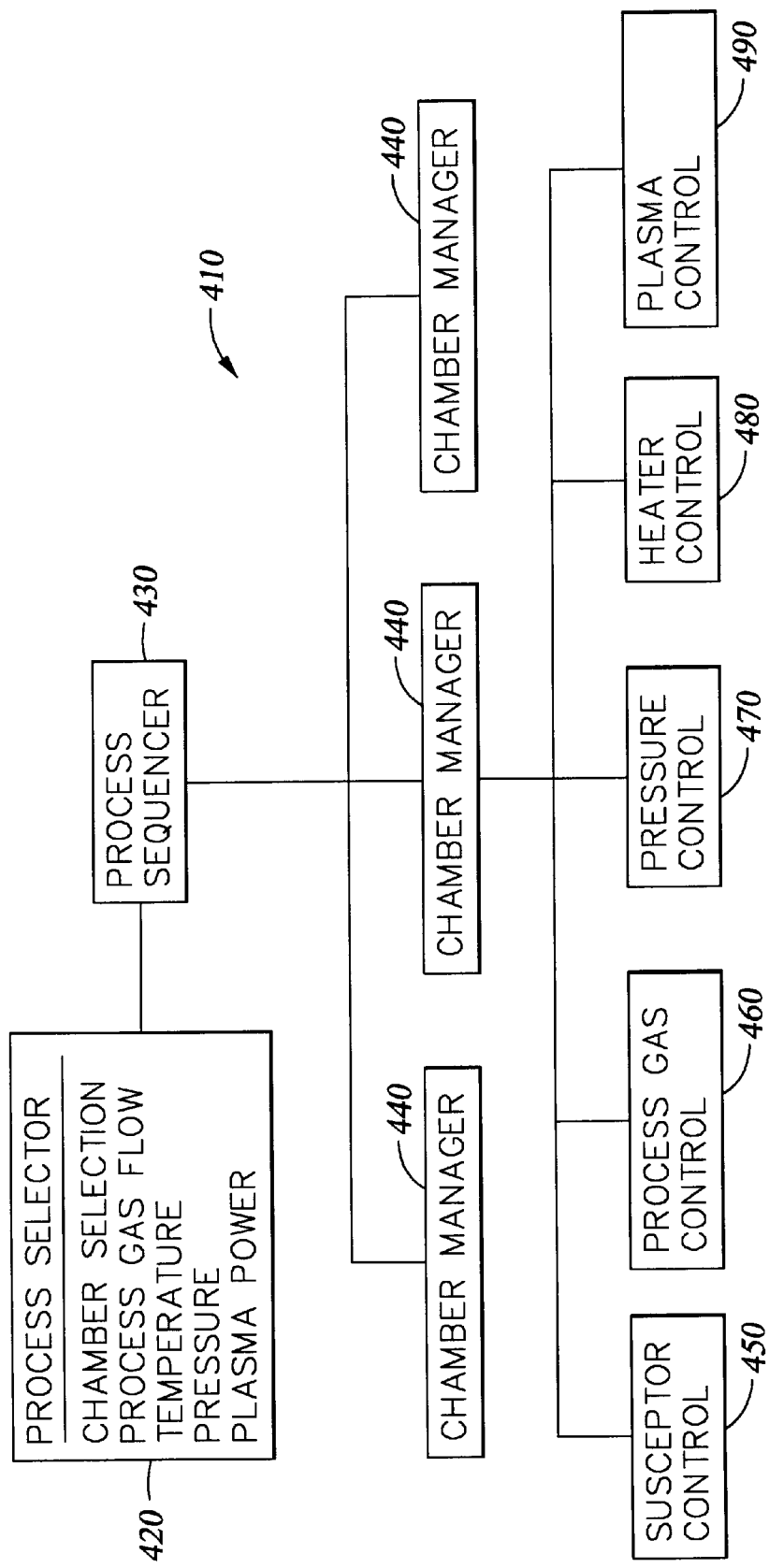
FIG. 4 is a flow chart of a process control computer program product used in conjunction with the exemplary CVD plasma reactor of FIG. 2.

Referring to FIG. 4, the process can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 4 shows an illustrative block diagram of the hierarchical control structure of the computer program 410. A user enters a process set number and process chamber number into a process selector subroutine 420 in response to menus or screens displayed on the CRT monitor 40 by using the light pen 44 interface. The process sets are predetermined sets of process parameters necessary to carry out specified processes, and are identified by predefined set numbers. The process selector subroutine 420 the (i) selects a desired process chamber on a cluster tool such as an Centura® platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 10 according to the process set determined by the sequencer subroutine 430. For example, the chamber manager subroutine 440 comprises program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the reactor 10.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 10 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 4. The susceptor control positioning subroutine 450 comprises program code for controlling chamber components that are used to load the substrate onto the susceptor 12, and optionally to lift the substrate to a desired height in the reactor 10 to control the spacing between the substrate and the gas distribution manifold 11. When a substrate is loaded into the reactor 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is flowed into the reactor 10 to stabilize the pressure in the chamber before reactive process gases are introduced into the chamber. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas is to be vaporized from a liquid precursor, the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the reactor 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the reactor 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 490 comprises program code for setting the RF bias voltage power level applied to the process electrodes in the reactor 10, and optionally, to set the level of the magnetic field generated in the reactor. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The pretreatment and method for forming a pretreated layer of the present invention is not limited to any specific apparatus or to any specific plasma excitation method.

Figure 5:
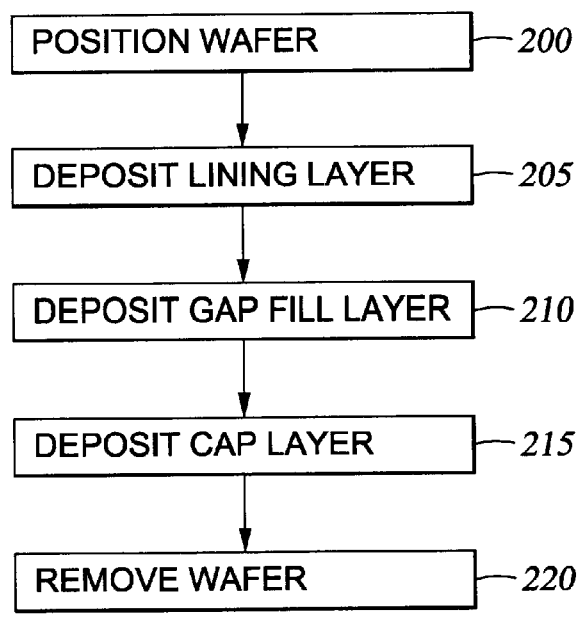
FIG. 5 is a flow chart illustrating steps undertaken in depositing liner and cap layers in a gap filling process according to one embodiment of the present invention.

Deposition of the Oxidized Organosilane or Organosiloxane Dielectric in a Three-Layer Gap Filling Process The oxidized organosilane or organosiloxane layer of the present invention can be used in a three-layer gap filling process as shown in FIG. 5 using the PECVD chamber of FIG. 2. Referring to FIG. 5, a wafer is positioned 200 in the reactor 10 and an oxidized organosilane layer having a low dielectric constant is deposited 205 by a PECVD process from a plasma comprising an organosilane compound and/or a organosiloxane compound. The deposition step 205 can include a capacitively coupled plasma or both an inductively and a capacitively coupled plasma in the process chamber 15 according to methods known in the art. An inert gas such as helium is commonly used in the PECVD deposition to assist in plasma generation. The oxidized organosilane layer is exposed to water at a temperature of about 50° C. to about 100° C. or to a hydrophobic-imparting surfactant at a temperature from about 10° C. to about 100° C. After exposure, the oxidized organosilane layer is cured at a temperature from about 100° C. to about 450° C.

A gap fill layer is then deposited 210 on the liner layer by known methods. The gap fill layer is preferably self-planarizing, such as spin-on polymers or oxides deposited in liquid form by reaction of methyl silane and hydrogen peroxide. A cap layer is then deposited 215 on the gap fill layer, preferably using the same process for depositing the lining layer 205. The wafer is then removed 220 from the reactor 10.

Referring to FIGS. 6A–6E, the three-layer gap filling process provides a PECVD lining layer 300 of the oxidized organosilane or organosiloxane polymer. The lining layer 300 acts as an isolation layer between a subsequent gap fill layer 302 and the underlying substrate surface 304 and metal lines 306, 308, 310 formed on the substrate surface. The gap fill layer 302 is capped by a PECVD capping layer 312 of the oxidized organosilane or organosiloxane polymer. This process is implemented and controlled using a computer program stored in the memory 38 of a computer controller 34 for a CVD reactor 10.

Figure 6A:
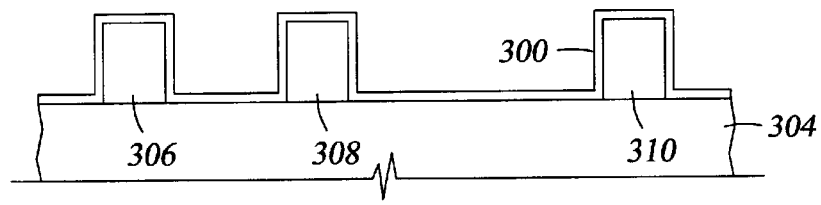
FIGS. 6A–6E is a schematic diagram of the layers deposited on a substrate by the process of FIG. 5.

Referring to FIG. 6A, the PECVD lining layer 300 is deposited in the reactor 10 by introducing an oxidizing gas such as $N_2O$, an organosilane or organosiloxane compound such as $CH_3SiH_3$ or $(CH_3)_2SiH_2$, and a carrier gas such as helium. The substrate is maintained at a temperature of from about −20° C. to about 400° C., and preferably is maintained at a temperature of approximately −20° C. to 40° C. throughout the deposition of the PECVD lining layer. The PECVD lining layer 300 is deposited with a process gas that includes a mixture of the organosilane and/or organosiloxane compound at a flow rate of about 5 sccm to about 500 sccm and the oxidizing gas at a flow rate of about 5 sccm to about 2000 sccm. The process gases are carried by an inert gas such He, Ar, Ne, or a relatively inert gas such as nitrogen, which are typically not incorporated into the film, at a flow rate of from about 0.2 lpm to about 20 lpm. The process gases react at a pressure from about 0.2 Torr to about 20 Torr, preferably less than 10 Torr, to form a conformal silicon oxide-based layer on the substrate surface 304 and metal lines 306, 308, 310. The reaction is plasma enhanced with a power density ranging from 0.05 $W/cm^2$ to 1000 $W/cm^2$, preferably a power density less than about 1 $W/cm^2$, most preferably a power density ranging from about 0.1 to about 0.3 $W/cm^2$.

For an 8" single wafer chamber, the high frequency RF source of approximately 13.56 MHz is preferably connected to a gas distribution system and driven at about 10 to about 250W while a low frequency RF source of about 350 KHz to 1 MHz is optionally connected to a susceptor and driven at about 0 to about 100W. In a preferred embodiment, the high frequency RF source is driven at about 20W to about 150W of pulsed RF power and the low frequency RF source is driven at about 0 to about 50W of pulsed RF power at a duty cycle from 10% to 30%. The pulsed RF power is rapidly cycled in short intervals, preferably having a frequency less than about 200 Hz. When the high frequency RF power is constant, the power level preferably ranges from about 20W to about 100W.

The oxidized organosilane or organosiloxane layer is then exposed to water at a temperature of about 50° C. to about 100° C., or to a hydrophobic surfactant such as hexamethyldisilazane at a temperature from about 10° C. to about 100° C., and cured at a pressure less than about 10 Torr and a temperature from about 100° C. to about 450° C.

Figure 6B:
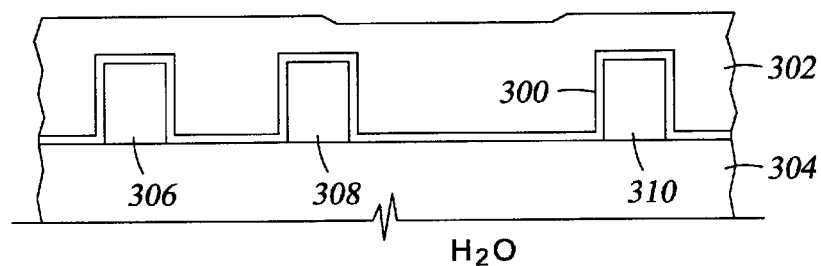

The above process conditions result in the deposition of a PECVD lining layer 300 (at about 2000 Å per minute) with improved barrier characteristics for the subsequent deposition of the gap filling layer 302 shown in FIG. 6B. The lining layer obtained from methylsilane has sufficient C—H bonds to be hydrophobic, and after exposure to water and curing, is an excellent moisture barrier. Deposition of a hydrophobic lining layer has a surprising and unexpected result of converting subsequent hydrophilic layers to hydrophobic layers.

The process gases for the gap filling layer 302 are preferably $SiH_4$, $CH_3SiH_3$, or $(CH_3)_2SiH_2$, and 50 wt % of hydrogen peroxide ($H_2O_2$) which is vaporized and mixed with an inert carrier gas, such as helium. However, the gap filling layer can be any dielectric layer which has an acceptable dielectric constant. Alternative silicon containing compounds can be used if byproducts are vapors at deposition conditions. Preferred alternative compounds incorporate oxysilano or silano groups, such as:

disilanomethane,
bis(methylsilano)methane,
1,2-disilanoethane,
2,2-disilanopropane,
1,3,5-trisilano-2,4,6-trimethylene (cyclic),
1,3-bis(silanomethylene)siloxane,
bis(1-methyldisiloxanyl)methane,
2,4,6,8-tetramethylcyclotetrasiloxane, or
1,2-disilanotetrafluoroethane.

Figure 6C:
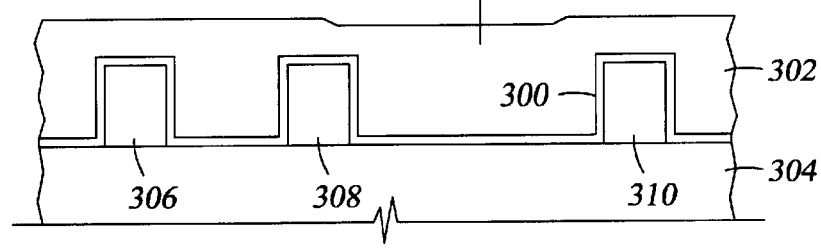
Figure 6D:
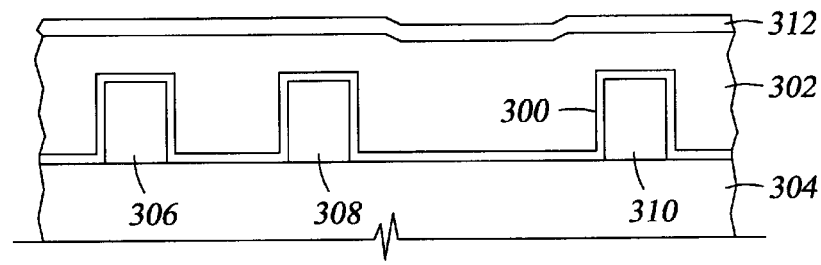

The process gas flows range from 0–2000 sccm for He, 10–200 sccm for $CH_3SiH_3$, and 0.1 to 3 g/min. for $H_2O_2$. The preferred gas flows range from 100–500 sccm for He, 20–100 sccm for $CH_3SiH_3$, and 0.1 to 1 g/min. for $H_2O_2$. These flow rates are given for a chamber having a volume of approximately 5.5 to 6.5 liters. Preferably, reactor 10 is maintained at a pressure of about 0.2 to about 5 torr during deposition of the gap filling layer 302. The gap filling layer 302 may be partially cured as shown in FIG. 6C to remove solvents such as water prior to deposition of a cap layer 312 as shown in FIG. 6D. Curing is done in the reactor 10 by pumping under an inert gas atmosphere under 10 Torr.

Gap filling layers produced from methylsilane are typically hydrophilic and have poor moisture barrier properties. When deposited on a hydrophobic lining layer produced from the preferred organosilicon compounds such as methylsilane, a gap filling layer produced from methylsilane surprisingly is hydrophobic and has good moisture barrier properties.

Figure 6E:
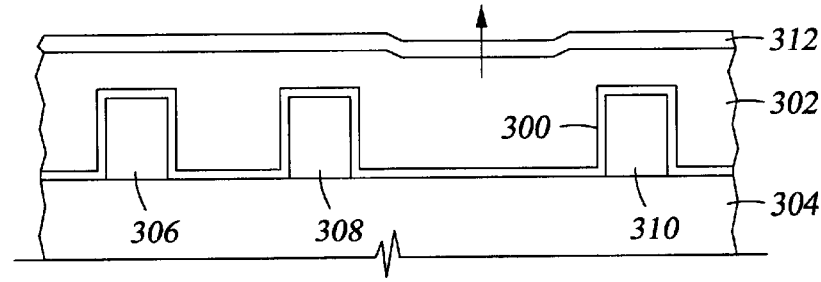

Referring to FIG. 6D, after deposition of the gap filling layer 302, the reactor 10 optionally resumes deposition of the oxidized organosilane or organosiloxane layer of the present invention for deposition of a capping layer 312. Referring to FIG. 6E, after deposition of the capping layer, if any, the deposited layers are cured in a furnace or another chamber at a temperature from about 100° C. to about 450° C. to drive off remaining solvent or water. Of course, processing conditions will vary according to the desired characteristics of the deposited films.

Deposition of a Dual Damascene Structure

Figure 7:
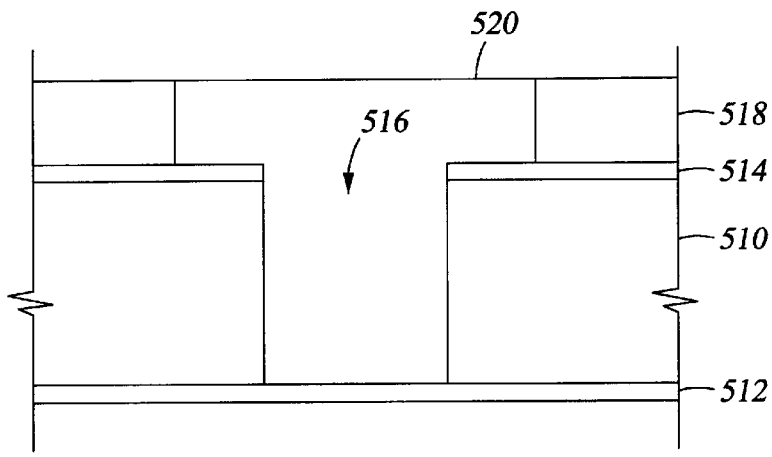
FIG. 7 is a cross sectional view showing a dual damascene structure comprising the silicon oxide layers of the present invention.

A dual damascene structure which includes an oxidized organosilane or organosiloxane layers as an etch stop or as an intermetal dielectric layer is shown in FIG. 7. When the oxidized organosilane or organosiloxane is used as an etch stop, a first dielectric layer 510 is deposited on a substrate 512 and then the oxidized organosilane or organosiloxane etch stop 514 is deposited on the first dielectric layer, exposed to water or a hydrophobic surfactant, and cured at an elevated temperature. The etch stop is then pattern etched to define the openings of the contacts/vias 516. A second dielectric layer 518 is then deposited over the patterned etch stop and then pattern etched by conventional methods to define the interconnect lines 520. A single etch process is then performed to define the interconnects down to the etch stop and to etch the unprotected dielectric exposed by the patterned etch stop to define the contacts/vias.

Referring again to FIG. 7, the damascene structure alternatively includes the oxidized organosilane or organsiloxane as an intermetal dielectric. A first dielectric layer 510, preferably consisting of the oxidized organosilane or organosiloxane, is deposited on a substrate 512, exposed to water or a hydrophobic surfactant, and cured at an elevated temperature. Then a conventional silicon oxide, silicon nitride, or hydrogenated silicon carbide etch stop 514 is deposited on the first dielectric layer. The etch stop is then patterned to define the openings of the contacts/vias 516. A second dielectric layer 518, consisting of the oxidized organosilane or organosiloxane, is then deposited over the patterned etch stop, exposed to water or a hydrophobic surfactant, and cured. The second dielectric layer 518 is then patterned to define the interconnect lines 520. A single etch process is then performed to define the interconnects down to the etch stop and to etch the unprotected dielectric exposed by the patterned etch stop to define the contacts/vias.

Figure 8A:
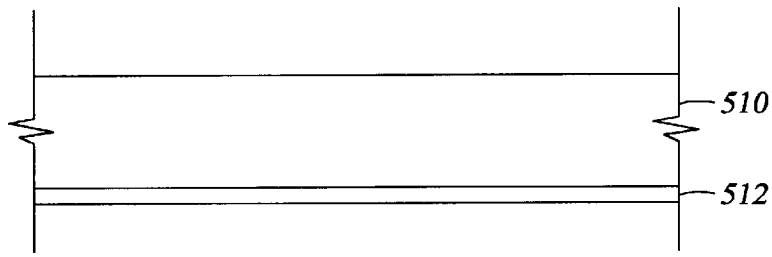
FIGS. 8A–8H are cross sectional views showing one embodiment of a dual damascene deposition sequence of the present invention.
Figure 8B:
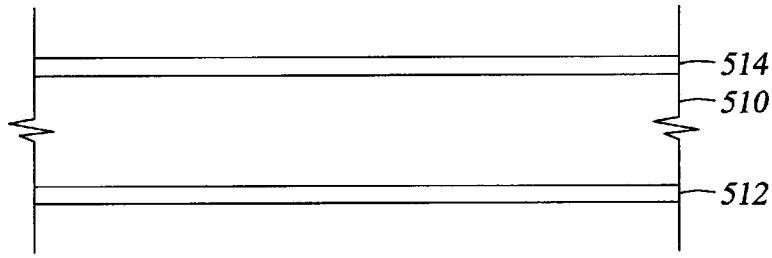
Figure 8C:
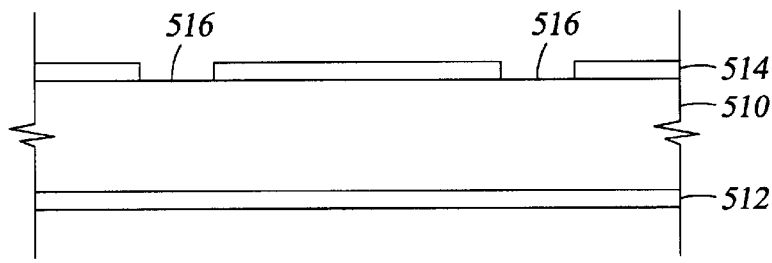
Figure 8D:
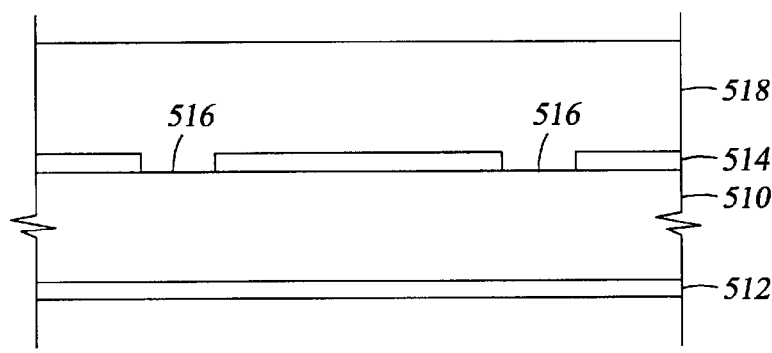
Figure 8E:
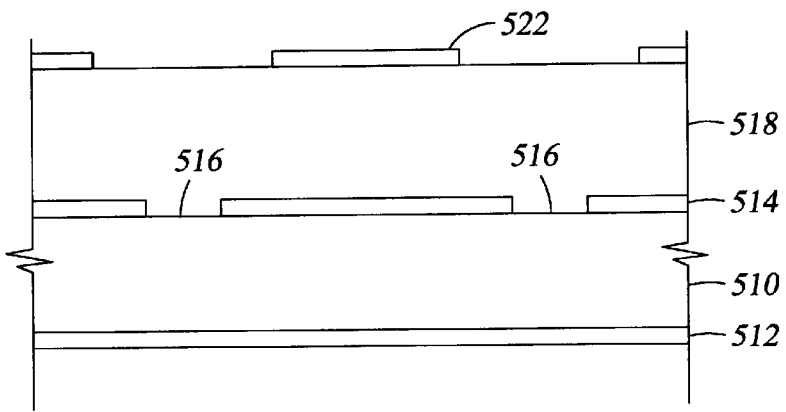
Figure 8F:
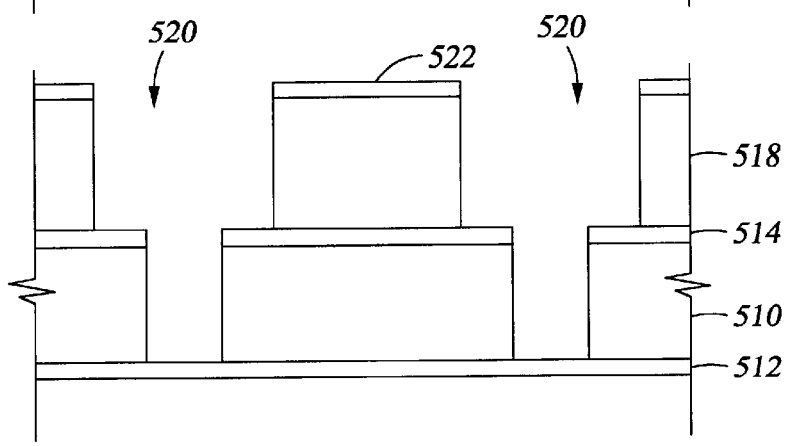
Figure 8G:
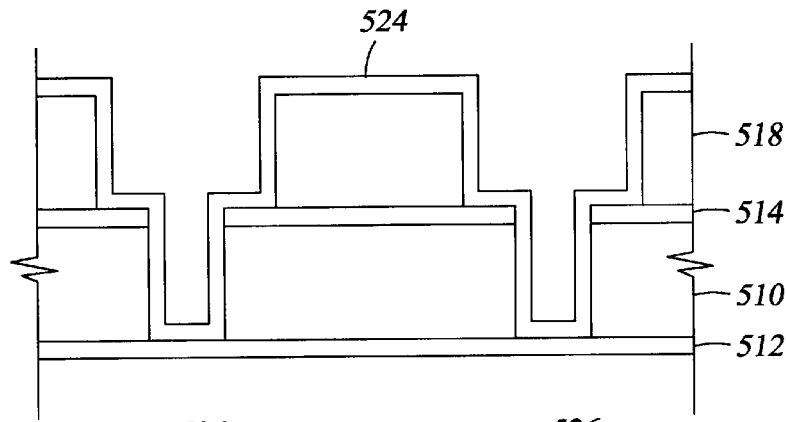
Figure 8H:
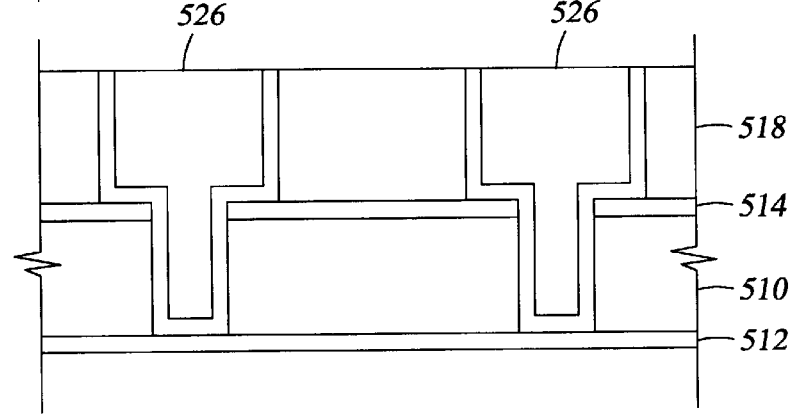

A preferred dual damascene structure fabricated in accordance with the invention includes a lining layer as shown in FIG. 8H, and the method of making the structure is sequentially depicted schematically in FIGS. 8A–8H, which are cross sectional views of a substrate having the steps of the invention formed thereon.

As shown in FIG. 8A, an initial first dielectric layer 510, such as parylene, FSG, silicon oxide, or the like, is deposited on the substrate 512 to a thickness of about 5,000 to about 10,000 Å, depending on the size of the structure to be fabricated. As shown in FIG. 8B, the low k etch stop 514, which is the oxidized organosilane or organosiloxane layer, is then deposited on the first dielectric layer to a thickness of about 200 to about 1000 Å using low levels of RF power, exposed to water, and cured. The low k etch stop 514 is then pattern etched to define the contact/via openings 516 and to expose first dielectric layer 510 in the areas where the contacts/vias are to be formed as shown in FIG. 8C. Preferably, low k etch stop 514 is pattern etched using conventional photolithography and etch processes using fluorine, carbon, and oxygen ions. After low k etch stop 514 has been etched to pattern the contacts/vias and the photo resist has been removed, a second dielectric layer 518 is deposited over etch stop 514 to a thickness of about 5,000 to about 10,000 A as shown in FIG. 8D. A second dielectric layer 518 is then patterned to define interconnect lines 520, preferably using conventional photolithography processes with a photo resist layer 522 as shown in FIG. 8E. The interconnects and contacts/vias are then etched using reactive ion etching or other anisotropic etching techniques to define the metallization structure (i.e., the interconnect and contact/via) as shown in FIG. 8F. Any photo resist or other material used to pattern the etch stop 514 or the second dielectric layer 518 is removed using an oxygen strip or other suitable process.

The metallization structure is then formed with a conductive material such as aluminum, copper, tungsten or combinations thereof. Presently, the trend is to use copper to form the smaller features due to the low resistivity of copper (1.7 $\mu\Omega$-cm compared to 3.1 $\mu\Omega$-cm for aluminum). Preferably, as shown in FIG. 8G, a suitable barrier layer 524 such as tantalum nitride is first deposited conformally in the metallization pattern to prevent copper migration into the surrounding silicon and/or dielectric material. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 8H.

Deposition of Adhesive Layers

Figure 9:
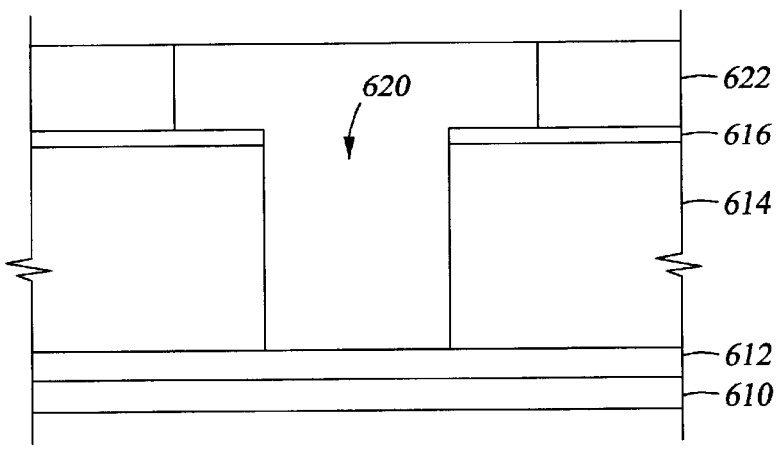
FIG. 9 is a cross sectional view showing an adhesive layer comprising the silicon oxide layer of the present invention between a premetal dielectric layer and an intermetal dielectric layer.

A dual damascene structure which includes an oxidized organosilane or organosiloxane layer as an adhesive layer between a premetal dielectric layer and an intermetal dielectric layer is shown in FIG. 9. The oxidized organosilane or organosiloxane adhesive layer 612 is deposited on a premetal dielectric layer 610 such as a conventional PSG or BPSG layer and then cured. An intermetal dielectric layer 614, preferably a low k dielectric polymer layer, is then deposited over the adhesive layer 612. A conventional silicon oxide or silicon nitride etch stop 616 is then patterned by conventional methods to define vias 620. A second intermetal dielectric layer 622, preferably the low k dielectric polymer, is then deposited over the patterned etch stop and then patterned to define the interconnect lines. A single etch process is then performed to define the interconnects down to the etch stop and to etch the unprotected dielectric exposed by the patterned etch stop to define the contacts/vias prior to metallization.

Figure 10A:
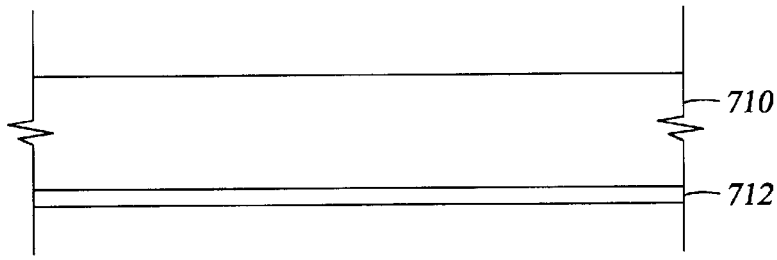
FIGS. 10A–10H are cross sectional views showing a dual damascene deposition sequence wherein the silicon oxide of the present invention is used to adhere an intermetal dielectric film to a conventional etch stop.
Figure 10B:
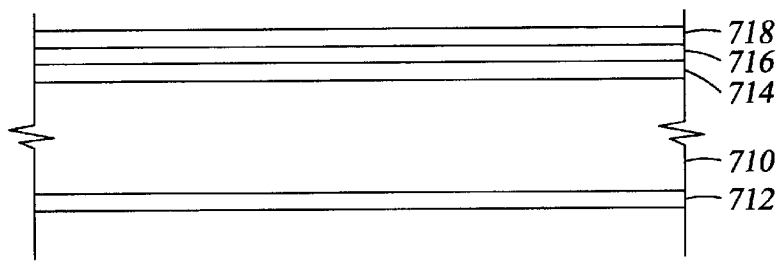
Figure 10C:
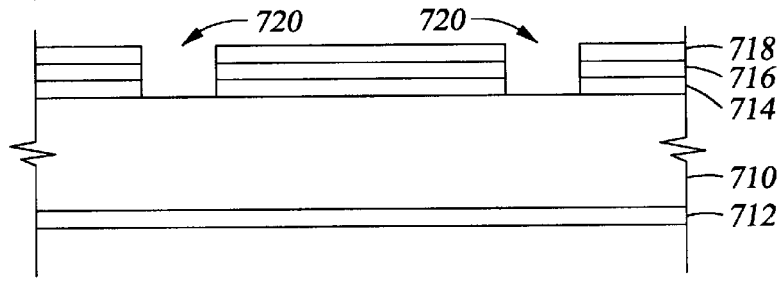
Figure 10D:
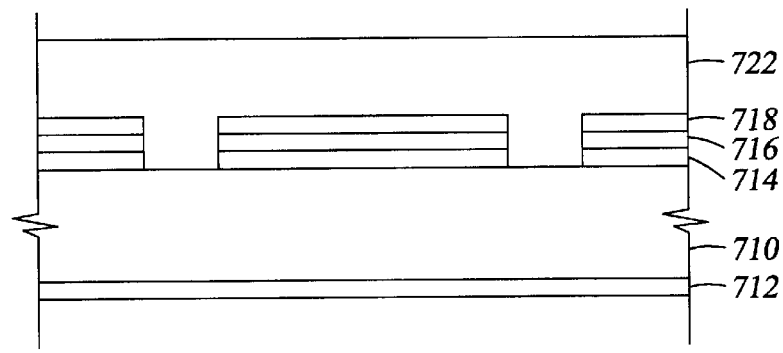
Figure 10E:
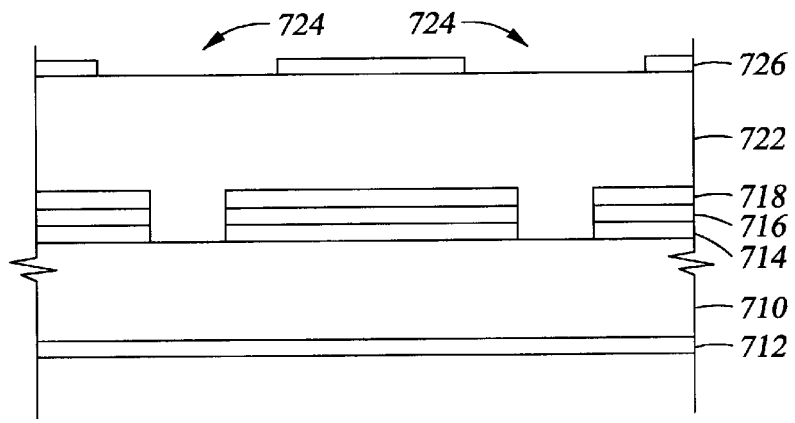
Figure 10F:
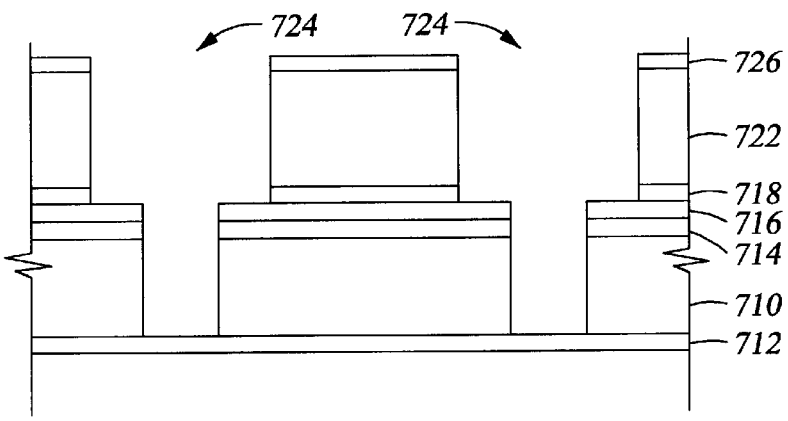
Figure 10G:
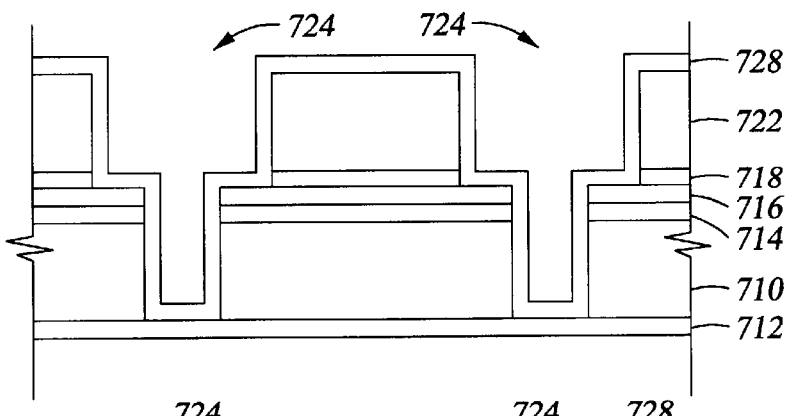
Figure 10H:
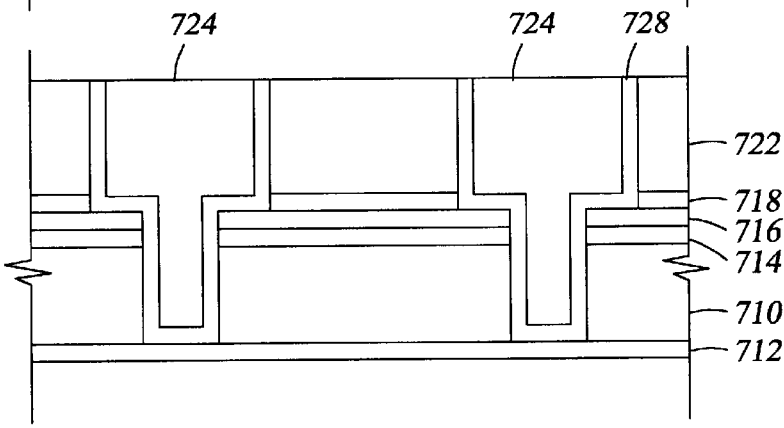

A preferred dual damascene structure comprising an adhesive layer in accordance with the invention is shown in FIG. 10H, and the method of making the structure is sequentially depicted schematically in FIGS. 10A–10H, which are cross sectional views of a substrate having the steps of the invention formed thereon.

As shown in FIG. 10A, an initial first intermetal dielectric layer 710, such as parylene, FSG, silicon oxide, or the like, is deposited on a substrate 712 to a thickness of about 5,000 to about 10,000 Å, depending on the size of the structure to be fabricated. As shown in FIG. 10B, a low k adhesive layer 714, which is the oxidized organo silane layer, is then deposited on the first intermetal dielectric layer 710 to a thickness of about 50 to about 200 Å. A conventional silicon oxide or silicon nitride etch stop 716 is the deposited on the adhesive layer 714 to a thickness of about 50 to about 200 Å. A second low k adhesive layer 718, which is the oxidized organo silane layer, is then deposited on the etch stop 716 to a thickness of about 50 to about 200 Å. The etch stop 716 and adhesive layers 714, 718 are then pattern etched to define the contact/via openings 720 and to expose first intermetal dielectric layer 710 in the areas where the contacts/vias are to be formed as shown in FIG. 10C. Preferably, the etch stop 716 is pattern etched using conventional photolithography and etch processes using fluorine, carbon, and oxygen ions. After the etch stop 716 and adhesive layers 714, 718 have been etched to pattern the contacts/vias and the photo resist has been removed, a second intermetal dielectric layer 722 is deposited over second adhesive layer 718 to a thickness of about 5,000 to about 10,000 Å as shown in FIG. 10D. The second intermetal dielectric layer 722 is then patterned to define interconnect lines 724, preferably using conventional photolithography processes with a photo resist layer 726 as shown in FIG. 10E. The interconnects and contacts/vias are then etched using reactive ion etching or other anisotropic etching techniques to define the metallization structure (i.e., the interconnect and contact/via) as shown in FIG. 10F. Any photo resist or other material used to pattern the etch stop 716 or the second intermetal dielectric layer 722 is removed using an oxygen strip or other suitable process.

The metallization structure is then formed with a conductive material such as aluminum, copper, tungsten or combinations thereof. Presently, the trend is to use copper to form the smaller features due to the low resistivity of copper (1.7 $\mu\Omega$-cm compared to 3.1 $\mu\Omega$-cm for aluminum). Preferably, as shown in FIG. 10G, a suitable barrier layer 728 such as tantalum nitride is first deposited conformally in the metallization pattern to prevent copper migration into the surrounding silicon and/or dielectric material. Thereafter, copper is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 10H.

Dual Damascene Integration

Another preferred dual damascene structure comprises silicon oxide layers having different dielectric constants to resist crosstalk between layers, and is deposited as shown in FIGS. 11A–11D, which are cross sectional views of a substrate having the steps of the invention formed thereon.

As shown in FIG. 11A, a via level dielectric layer 810, having a carbon content greater than 20% by atomic weight, is deposited on a substrate 812 to a thickness of about 5,000 to about 10,000 Å, depending on the size of the structure to be fabricated. The via level dielectric layer is preferably deposited by reacting $N_2O$ and trimethylsilane at an RF power level of 500 W with a duty cycle of 10%. The via level dielectric layer is then exposed to water or a hydrophobic surfactant and cured. As shown in FIG. 11A, the via level dielectric level is then pattern etched to form the vias and contact holes 814 with conventional photolithography and etch processes for high carbon materials using fluorine, carbon, and oxygen ions.

As shown in FIG. 11B, trench level dielectric layer 822 having a carbon content less than 10% by atomic weight, is deposited over the via level dielectric layer 810 to a thickness of about 5,000 to about 10,000 Å. The trench level dielectric layer is preferably deposited by reacting $N_2O$ and methysilane at an RF power level of 500 W with a duty cycle of 30%. The trench level dielectric layer 822 is then exposed to water and cured trench level dielectric layer 822 is then pattern etched to define interconnect lines 824 as shown in FIG. 11B, using conventional photolithography processes and etch processes that are effective for low carbon materials and not effective for high carbon materials. Any photo resist or other material used to pattern the dielectric layers is removed using chemical mechanical polishing, an oxygen strip, or other suitable process.

The metallization structure is then formed with a conductive material such as aluminum, copper, tungsten or combinations thereof. Presently, the trend is to use copper to form the smaller features due to the low resistivity of copper (1.7 $\mu\Omega$-cm compared to 3.1 $\mu\Omega$-cm for aluminum). Preferably, as shown in FIG. 11C, a suitable barrier layer 828 such as tantalum nitride is first deposited conformally in the metallization pattern to prevent copper migration into the surrounding silicon and/or dielectric material. Thereafter, copper 830 is deposited as shown in FIG. 11D using either chemical vapor deposition, physical vapor deposition, electroplating, or combinations thereof to form the conductive structure. Once the structure has been filled with copper or other metal, the surface is planarized using chemical mechanical polishing or other planarizing methods.

The invention is further described by the following examples.

EXAMPLE

The following example demonstrates deposition of an oxidized organosilane or organosiloxane film followed by treatment with water or a hydrophobic-imparting surfactant. The example was performed in a chemical vapor deposition chamber, and in particular, a "CENTURA DxZ" system which includes a solid-state RF matching unit with a two-piece quartz process kit, both fabricated and sold by Applied Materials, Inc., Santa Clara, Calif.

Non-Pulsed RF Power

An oxidized dimethylsilane film was deposited at a chamber pressure of 3.0 Torr and temperature of 15° C. from reactive gases which were flowed into the reactor as follows:

| | |
|---|---|
| Dimethylsilane, $(CH_3)_2SiH_2$, at | 55 sccm |
| Nitrous oxide, $N_2O$, at | 300 sccm |
| Helium, He, at | 4000 sccm. |

The substrate was positioned 600 mil from the gas distribution showerhead and 20W of high frequency power (13 MHz) was applied to the showerhead for plasma enhanced deposition of an oxidized dimethylsilane layer. The oxidized dimethylsilane material had a dielectric constant of about 2.5 and was hydrophobic. The dimethylsilane layer was then exposed to water at a temperature of 20° C. by flowing 1 gram/minute of water vapor into the chamber. After exposure to water for 60 seconds, the dimethylsilane layer was cured at a temperature of 400° C. for 30 minutes.

HYPOTHETICAL EXAMPLES

The following examples describe deposition of an oxidized organosilane or organosiloxane film followed by treatment with water or a hydrophobic-imparting surfactant. The examples are described for a chemical vapor deposition chamber, and in particular, a "CENTURA DxZ" system which includes a solid-state RF matching unit with a two-piece quartz process kit, both fabricated and sold by Applied Materials, Inc., Santa Clara, Calif.

Pulsed RF Power

An oxidized 1,3,5-trisilano-2,4,6-trimethylene (cyclic) film is deposited at a chamber pressure of 3.0 Torr and temperature of 15° C. from reactive gases which flow into the reactor as follows:

| | |
|---|---|
| 1,3,5-trisilano-2,4,6-trimethylene, —$(-SiH_2CH_2-)_3$—(cyclic), at | 20 sccm |
| Nitrous oxide, $N_2O$, at | 300 sccm |
| Helium, He, at | 4000 sccm. |

The substrate is positioned 600 mil from the gas distribution showerhead and 50W of pulsed high frequency power (13 MHz) is applied to the showerhead for plasma enhanced deposition of an oxidized 1,3,5-trisilano-2,4,6-trimethylene layer. The deposited layer is then exposed to water at a temperature of 20° C. by flowing 1 gram/minute of water vapor into the chamber. After exposure to water for 60 seconds, the deposited layer is cured at a temperature of 400° C. for 30 minutes.

Pulsed RF Power

An oxidized 1,3-dimethyldisiloxane film is deposited at a chamber pressure of 3.0 Torr and temperature of 15° C. from reactive gases which are flowed into the reactor as follows:

| | |
|---|---|
| 1,3-Dimethyldisiloxane, $CH_3$—$SiH_2$—O—$SiH_2$—$CH_3$, at | 30 sccm |
| Nitrous oxide, $N_2O$, at | 300 sccm |
| Helium, He, at | 4000 sccm. |

The substrate is positioned 600 mil from the gas distribution showerhead and 50W of pulsed high frequency RF power (13 MHz) is applied to the showerhead for plasma enhanced deposition of an oxidized dimethyldisiloxane layer. The deposited layer was then exposed to the surfactant at a temperature of 20° C. by flowing 200 sccm of hexamethyldisilazane into the chamber. After exposure to hexamethyldisilazane for 60 seconds, the deposited layer was cured a temperature of 400° C. for 30 minutes.

Microwave/RF Power

An oxidized 1,3-dimethyldisiloxane film is deposited at a chamber pressure of 3.0 Torr and temperature of 15° C. from reactive gases which are flowed into the reactor as follows:

| | |
|---|---|
| 1,3-Dimethyldisiloxane, $CH_3$—$SiH_2$—O—$SiH_2$—$CH_3$, at | 30 sccm |
| Nitrous oxide, $N_2O$, at | 300 sccm |
| Helium, He, at | 4000 sccm. |

Prior to entering the chamber, the nitrous oxide is dissociated in a microwave applicator that provides 3000W of microwave energy. The substrate is positioned 600 mil from the gas distribution showerhead and 50W of high frequency RF power (13 MHz) is applied to the showerhead in cycles for plasma enhanced deposition of an oxidized dimethyldisiloxane layer. Each cycle provides RF power for 30% of the cycle. The deposited layer was then exposed to surfactant at a temperature of 20° C. by flowing 200 sccm of hexamethyldisilazane into the chamber. After exposure to hexamethyldisilazane for 60 seconds, the deposited layer was cured at a temperature of 400° C. for 30 minutes.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising;
   depositing a first material;
   depositing a low dielectric constant material contacting the first material, wherein the low dielectric constant material is a constant material is a silicon oxide based material comprising carbon-silicon bonds and a carbon content of between about 1% and about 50% by atomic weight on a substrate;
   exposing the low dielectric constant material to water or a hydrophobic-imparting surfactant; and
   curing the low dielectric constant material; and then
   depositing a seecond material contacting the low dielectric constant material.

2. The method of claim 1, wherein the first material comprises metal lines and the second material comprises a gap-fill dielectric material.

3. The method of claim 1, wherein the first material comprises a first dielectric layer, the low dielectric constant material comprises an etch stop or adhesion layer, and the second material comprises a second dielectric layer or etch stop.

4. The method of claim 3, further comprising etching the first dielectric layer to define one or more vertical interconnects and etching the second dielectric layer to define one or more horizontal interconnects.

5. The method of claim 1, wherein the first material comprises a dielectric layer, the low dielectric constant material comprises an etch stop, adhesion layer, or dielectric layer, and the second material comprises a barrier layer or metal layer.

6. The method of claim 1, wherein the first material is a first dielectric layer comprising one or more vertical interconnects, the low dielectric constant material comprises an etch stop, adhesion layer, or dielectric layer, and the second material comprises a second dielectric layer contacting the first dielectric layer and defining one or more horizontal interconnects.

7. The method of claim 1, wherein the low dielectric constant material is deposited by reacting one or more silicon compounds that contain carbon with an oxidizing gas at an RF power level from about 10W to about 500W.

8. The method of claim 7, wherein the one or more silicon compounds are selected from a group consisting of methylsilane, dimethylsilane, trimethylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, 1,3-dimethyldisiloxane, 1,3-bis(silanomethylene)disiloxane, bis(1-methyldisiloxanyl)methane, 2,2-bis(1-methyldisiloxanyl)-propane, 2,4,6,8-tetramethylcyclotetrasiloxane, 2,4,6,8,10-pentamethylcyclopentasiloxane, 1,3,5,7-tetrasilano-2,6-dioxy-4,8-dimethylene, fluorinated carbon derivatives thereof, and combinations thereof and combinations thereof.

9. The method of claim 1, wherein the low dielectric constant material is exposed to a surfactant selected from a group consisting of hexamethyldisilazane, trimethylsilyldiethylamine, phenyldimethylsilyldimethylamine, trimethoxysilyldimethylamine, tris(trifluoromethyl)-silyldimethylamine, bis(trimethylsilyl)hydrazine, 1-phenyldimethylsilyl-2-methyl-hydrazine, 1-trimethoxysilyl-2-methylhydrazine, 1-tris(trifluoromethylsilyl)-2-methyl-hydrazine, and trimethylchlorosilane, and is cured at a temperature from about 100° C. to about 450° C.

10. The method of claim 1, wherein the low dielectric constant has a carbon content between about 5% and about 30% by atomic weight.

11. The method of claim 1, wherein the low dielectric constant material is exposed to the hydrophobic-imparting surfactant and heated to a temperature between about 10°C and about 100° C.

12. The method of claim 1, wherein the oxidizing gas is N$_2$O or O$_2$.

13. The method of claim 1, wherein the low dielectric constant material is deposited at a chamber pressure from about 0.2 Torr to about 2 Torr.

14. The method of claim 1, wherein the low dielectric constant material is deposited at a substrate temperature from about −20° C. to about 400° C.

15. The method of claim 1, wherein the low dielectric constant material has a dielectric constant of about 3 or less.

16. A method for processing a substrate, comprising:
depositing a first material;
depositing a silicon oxide based on material comprising carbon-silicon bonds and a carbon content of between about 1% and about 50% by atomic weight on a substrate by reacting one or more silicon compounds that contain carbon with an oxidizing gas at an RF plasma condicitions:
exposing the silicon oxide-based material to water at a temperature from about 50° C. to about 100° C., or to a hydrophobic-imparting surfactant at a temperature from about 10°C. to about 100° C.;
curing the silicon oxide based material at a temperature from about 100° to about 400° C.; and
depositing a second material on the silicon oxide based material.

17. The method of claim 16, wherein the first material comprises metal lines and the second material comprises a gap-fill dielectric material.

18. The method of claim 16, wherein the first material comprises a first dielectric layer, the silicon oxide based material comprises an etch stop or adhesion layer, and the second material comprises a second dielectric layer or etch stop.

19. The method of claim 18, further comprising etching the first dielectric layer to define one or more vertical interconnects and etching the second dielectric layer to define one or more horizontal interconnects.

20. The method of claim 16, wherein the first material comprises a dielectric layer, the silicon oxide based material comprises an etch stop, adhesion layer, or dielectric layer, and the second material comprises a barrier layer or metal layer.

21. The method of claim 16, wherein the first material is a first dielectric layer comprising one or more vertical interconnects, the silicon oxide based material comprises an etch stop, adhesion layer, or dielectric layer, and the second material comprises a second dielectric layer contacting the first dielectric layer and defining one or more horizontal interconnects.

22. The method of claim 9, wherein the silicon oxide-based film is cured at a temperature at or above about 400° C.

23. The method of claim 16, wherein the one or more silicon compounds are selected from a group consisting of methylsilane, dimethylsilane, trimethylsilane, disilanomethane, bis(methylsilano)methane, 1,2-disilanoethane, 1,2-bis(methylsilano)ethane, 2,2-disilanopropane, 1,3,5-trisilano-2,4,6-trimethylene, 1,3-dimethyldisiloxane, 1,3-bis(silanomethylene)disiloxane, bis(1-methyldisiloxanyl)methane, 2,2-bis(1-methyldisiloxanyl)-propane, 2,4,6,8-tetramethylcyclotetrasiloxane, 2,4,6,8,10-pentamethylcyclopentasiloxane, 1,3,5,7-tetrasilano-2,6-dioxy-4,8-dimethylene, fluorinated carbon derivatives thereof, and combinations thereof.

24. The method of claim 16, wherein the silicon oxide based film is exposed to a surfactant selected from a group consisting of hexamethyldisilazane, trimethylsilyldiethylamine, phenyldimethylsilyldimethylamine, trimethoxysilyldimethylamine, tris(trifluoromethyl)-silyldimethylamine, bis(trimethylsilyl)hydrazine, 1-phenyldimethylsilyl-2-methyl-hydrazine, 1-trimethoxysilyl-2-methylhydrazine, 1-tris(trifluoromethylsilyl)-2-methyl-hydrazine, and trimethylchlorosilane, and is cured at a temperature from about 100° C. to about 450° C.

25. The method of claim 16, wherein the silicon oxide based material has a carbon content between about 5% and about 30% by atomic weight.

26. The method of claim 16, wherein the silicon oxide-based material is exposed to the hydrophobic-imparting surfactant and heated to a temperature between about 10°C and about 100° C.

27. The method of claim 16, wherein the oxidizing gas is N$_2$O or O$_2$.

28. The method of claim 16, wherein the silicon oxide based material is deposited at a chamber pressure from about 0.2 Torr to about 2 Torr.

29. The method of claim 16, wherein the silicon oxide based material is deposited at a substrate temperature from about −20° C. to about 400° C.

30. The method of claim 16, wherein the silicon oxide based material has a dielectric constant of about 3 or less.

* * * * *

UNITED STATES PATENT AND TRADEMARK OFFICE
CERTIFICATE OF CORRECTION

PATENT NO. : 6,448,187 B2
DATED : September 10, 2002
INVENTOR(S) : Yau et al.

It is certified that error appears in the above-identified patent and that said Letters Patent is hereby corrected as shown below:

Column 1,
Line 16, please change "modem" to -- modern --.

Column 7,
Line 57, please change "hexanethyldisilazane" to -- hexamethyldisilazane --.

Column 16,
Line 51, please change "10,000 A" to -- 10,000 Å --.

Column 20,
Line 55, please change "seecond" to -- second --.

Column 21,
Line 27, please delete the second occurrence of "and combinations thereof".

Signed and Sealed this

Eighth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,448,187 B2  
DATED : September 10, 2002  
INVENTOR(S) : Yau et al.

It is certified that error appears in the above-identified patent and that said Letters Patent is hereby corrected as shown below:

Column 20,
Line 48, delete "is a constant material".

Column 21,
Line 38, add "material" after "constant".
Line 56, delete "on".
Line 67, change "400°" to -- 450° --.

Signed and Sealed this

Seventh Day of December, 2004

JON W. DUDAS
*Director of the United States Patent and Trademark Office*